(12) United States Patent
Machida

(10) Patent No.: US 7,982,240 B2
(45) Date of Patent: Jul. 19, 2011

(54) BIDIRECTIONAL ELECTRONIC SWITCH

(75) Inventor: Osamu Machida, Saitama (JP)

(73) Assignee: Sanken Electric Co., Ltd. (JP)

( * ) Notice: Subject to any disclaimer, the term of this patent is extended or adjusted under 35 U.S.C. 154(b) by 230 days.

(21) Appl. No.: 12/336,106

(22) Filed: Dec. 16, 2008

(65) Prior Publication Data

US 2009/0159925 A1 Jun. 25, 2009

(30) Foreign Application Priority Data

Dec. 21, 2007 (JP) ................. 2007-330690

(51) Int. Cl.
*H01L 29/872* (2006.01)
*H01L 29/66* (2006.01)
(52) U.S. Cl. ........ 257/133; 257/117; 257/128; 257/427; 257/658; 257/E29.338; 438/270
(58) Field of Classification Search .......... 257/194, 257/133, 119, 128, 427, 658, 341; 438/270
See application file for complete search history.

(56) References Cited

U.S. PATENT DOCUMENTS

| 4,791,072 | A | * | 12/1988 | Kiehl | 438/169 |
|---|---|---|---|---|---|
| 6,087,740 | A | * | 7/2000 | Williams | 307/125 |
| 6,252,258 | B1 | * | 6/2001 | Chang et al. | 257/133 |
| 7,135,740 | B2 | * | 11/2006 | Chang | 257/341 |
| 2005/0212057 | A1 | * | 9/2005 | Tokuda et al. | 257/378 |
| 2005/0274977 | A1 | * | 12/2005 | Saito et al. | 257/192 |
| 2006/0071295 | A1 | * | 4/2006 | Chang | 257/510 |
| 2006/0118824 | A1 | * | 6/2006 | Otsuka et al. | 257/194 |
| 2008/0121895 | A1 | * | 5/2008 | Sheppard et al. | 257/76 |
| 2009/0206363 | A1 | * | 8/2009 | Machida et al. | 257/133 |

FOREIGN PATENT DOCUMENTS

WO WO2004/114508 A1 5/2004

* cited by examiner

*Primary Examiner* — Zandra Smith
*Assistant Examiner* — Tsz K Chiu
(74) *Attorney, Agent, or Firm* — Woodcock Washburn LLP

(57) ABSTRACT

A main semiconductor region grown on a substrate has formed on its surface a pair of main electrodes spaced from each other, a gate electrode between the main electrodes, and a pair of diode-forming electrodes spaced farther away from the gate electrode than are the main electrodes. Making ohmic contact with the main semiconductor region, the pair of main electrodes serve both as drain or source of a HEMT switch and as cathodes of a pair of Schottky diodes integrated with the HEMT switch. Both gate electrode and diode-forming electrodes are in Schottky contact with the main semiconductor region.

10 Claims, 9 Drawing Sheets

BIDIRECTIONAL ELECTRONIC SWITCH

CROSS REFERENCE TO RELATED APPLICATIONS

This application claims priority to Japanese Patent Application No. 2007-330690, filed Dec. 21, 2007.

BACKGROUND OF THE INVENTION

This invention relates generally to switches, to electronic switches, and particularly to bidirectional, or alternating current (AC), switches for use in or with a variety of electric circuits notably including matrix converters and AC power supplies.

Perhaps the most familiar example of AC switches is a bidirectional triode thyristor, better known as TRIAC (TRIode for Alternating Current). The TRIAC has the weakness that, once triggered, it cannot be turned off at a controllable point in an AC cycle; rather, it remains conductive until the current flowing therethrough drops below a predetermined threshold.

Some bidirectional switching devices have been known which meet that requirement. One of them (shown in FIG. 1 of the drawings attached hereto) comprises two insulated-gate bipolar transistors (IGBTs) connected in inverse series with each other and two diodes connected in inverse parallel with the respective IGBTs. The two IGBTs are replaceable with insulated-gate or junction field-effect transistors or bipolar transistors. A further known bidirectional switch is an inverse parallel connection of two IGBTs These prior art bidirectional switching circuits, all incorporating normally-off solid-state switches, are alike in being unnecessarily complex in construction and high in turn-on resistance and voltage. Moreover, being made from semiconducting silicon materials with relatively low bandgaps, such known devices are not so high in antivoltage strength as can be desired.

WO 2004/114508 (FIG. 2) teaches a bidirectional switching device expressly designed to defeat all the noted drawbacks of the more conventional devices above. This prior art device offers the benefits of greater simplicity in construction and a higher antivoltage strength, the latter being a result of the fact that its semiconductor switch, the primary component, is made from a semiconducting compound such as, typically, nitride. Offsetting these benefits are its bulkiness and high manufacturing costs resulting from use of some unnecessarily self-contained components that are essential for its functioning. Difficulties have also been experienced in providing a reference potential needed for gating. The noted prior art devices with there inherent problems will be explained later in some more detail with reference to the attached drawings.

SUMMARY OF THE INVENTION

The present invention has it as an object to make the prior art bidirectional switching device, and particularly that of WO 2004/114508, simpler in construction, smaller in size, and cheaper and easier of fabrication than heretofore.

Another object of the invention is to stabilize the reference potential required for gating by the improved bidirectional switching device of the invention.

Briefly, the present invention may be summarized as a bidirectional switching device suitable for on-off control of alternating-current circuits. Included is a main semiconductor region having at least one semiconductor layer for providing a channel. The main semiconductor region has formed on its major surface a first and a second main electrode, a gate electrode, and a first and a second diode-forming electrode. The two main electrodes are formed in spaced-apart positions on, and in ohmic contact with, the major surface of the main semiconductor region. The gate electrode is positioned between the main electrodes for controlling current flow therebetween. The two diode-forming electrodes are disposed on opposite sides of the gate electrode and spaced farther away therefrom than are the main electrodes. These diode-forming electrodes are electrically interconnected.

Electrically, the bidirectional switching device of the foregoing construction is equivalent to the prior art device according to WO 2004/114508 cited above. The two main electrodes and gate electrode provide in combination with the main semiconductor region a semiconductor switch (e.g., high electron mobility transistor or other device depending upon the specific configuration of the main semiconductor region). The two main electrodes and two diode-forming electrodes constitute two diodes in combination with the main semiconductor region. The semiconductor switch is in parallel with the two diodes which are in inverse series with each other. Thus, instead of being self-contained as in the prior art, the semiconductor switch and the diodes share the main electrodes. The bidirectional switching device according to the invention is therefore simpler in construction, smaller in size, and easier and less costly of manufacture.

A further reduction in size and manufacturing cost is realized as the two main electrodes serve both as the main electrodes (e.g., either source or drain of a HEMT) of the semiconductor switch and as the electrodes (e.g., cathodes) of the diodes. Additionally, the semiconductor switch and two diodes are themselves more compactly integrated than heretofore, contributing to a higher speed operation of the bidirectional switching device through curtailment of parasitic impedance.

There is no flow of load current through the diodes, so that these diodes add little to the size of the main semiconductor region.

According to another significant feature of the invention, the electrically interconnected diodes are further electrically connected to a substrate of electroconductive material to which the main semiconductor region is coupled both mechanically and electrically. Thus is the potential of the electroconductive substrate stabilized, which is desirable for the following reasons:

As is well known, in HEMTs in general, the source is preferentially coupled to the substrate in order to maintain the substrate potential equal to that of the source. This scheme is not directly applicable to the bidirectional switching device of this invention in which each main electrode functions as source or drain depending upon whether a positive or negative voltage is impressed between these electrodes. There is no fixed source or no fixed drain.

A practical solution to this problem is to connect the back electrode on the underside of the electroconductive substrate to the two diode-forming electrodes. Then, irrespective of whether a positive or a negative voltage is applied between the pair of main electrodes, the electroconductive substrate will acquire a potential close to that of either of the main electrodes which is functioning as source. Consequently, the substrate will have its potential stabilized at a value close to that of the source, whichever of the two main electrodes it may be, much as in the standard HEMT in which the substrate potential is stabilized by connecting the source thereto. The stabilization of the substrate potential will lead to a more positive, reliable gating of current flow through the device.

In one embodiment of the invention, the two diode-forming electrodes are separately electrically connected to the electroconductive substrate having the back electrode, instead of being directly coupled together via a separate connector. The required electrical interconnection of the diode-forming electrodes can thus be accomplished in the easiest way.

The above and other objects, features and advantages of this invention will become more apparent, and the invention itself will best be understood, from a study of the following description and appended claims, with reference had to the attached drawings showing some pertinent prior art and the preferred embodiments of the invention.

DETAILED DESCRIPTION

Figure 1:
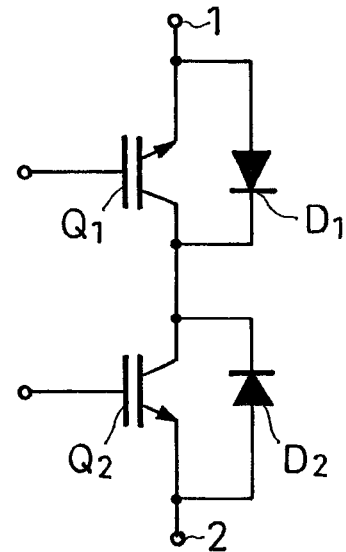
FIG. 1 is a schematic electrical diagram of a prior art bidirectional switching device.

The first cited prior art bidirectional switch is illustrated in FIG. 1 for a better understanding of the features and advantages of the instant invention. It has two IGBTs $Q_1$ and $Q_2$ interconnected in inverse series between a pair of main terminals 1 and 2, and two diodes $D_1$ and $D_2$ connected respectively in inverse parallel with the IGBTs. This and other comparable prior art devices possess the drawbacks pointed out already.

Figure 2:
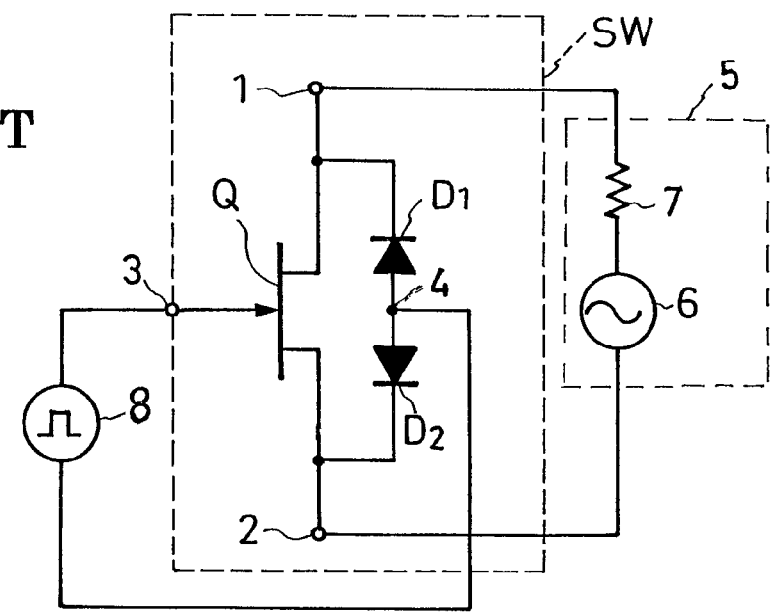
FIG. 2 is a schematic electrical diagram of another prior art bidirectional switching device bearing particular pertinence to the instant invention.

Given in FIG. 2 is the bidirectional switching device suggested by WO 2004/114508, supra, which is designed to overcome the drawbacks of the more conventional devices above. The prior art switching device SW has a high electron mobility transistor (HEMT) or like normally-on compound-semiconductor switch Q connected between a pair of main terminals 1 and 2 and having a gate connected to a gate terminal 3. Also included are two diodes $D_1$ and $D_2$ having their anodes interconnected. The first diode $D_1$ has its cathode connected to the first main terminal 1 whereas the second diode $D_2$ has its cathode connected to the second main terminal 2.

At 5 is indicated an electric circuit which is shown connected between the pair of main terminals 1 and 2 of this prior art bidirectional switching device SW thereby to be switched on and off. The electric circuit 5 is shown as comprising an AC power supply 6 and a load 7. Also external to the switching device SW, a gate control circuit 8 is shown connected between the gate terminal 3 and the junction 4 between the anodes of the diodes $D_1$ and $D_2$.

In the operation of this prior art bidirectional switching device SW, the normally-on compound semiconductor switch Q is off, and so is the bidirectional switching device SW, when the first main terminal 1 is higher in potential than the second main terminal 2 and, at the same time, when the gate terminal 3 is less in potential than the anode junction 4 of the diodes $D_1$ and $D_2$. The bidirectional switching device SW is of symmetrical design on both sides of the gate of the normally-on semiconductor switch Q. Consequently, the switch Q and therefore the complete device SW are also off when the second main terminal 2 is higher in potential than the first main terminal 1 and, at the same time, when the gate terminal 3 is less in potential than the anode junction 4 of the diodes $D_1$ and $D_2$. The switch Q turns on, and so does the complete device SW, when the potential of the gate terminal 3 rises above (e.g., either zero or some positive value) the threshold of the switch Q with respect to that of the anode junction 4 of the diodes $D_1$ and $D_2$.

Despite its admitted advantages over the more conventional contrivances of the type shown in FIG. 1, this prior art device is still too bulky and too costly of manufacture because of use of the normally-on switch Q and two diodes $D_1$ and $D_2$ which are self-contained in construction, having no parts in common. It has also been difficult to provide a stable reference potential for gating control of the switch Q.

Figure 3:
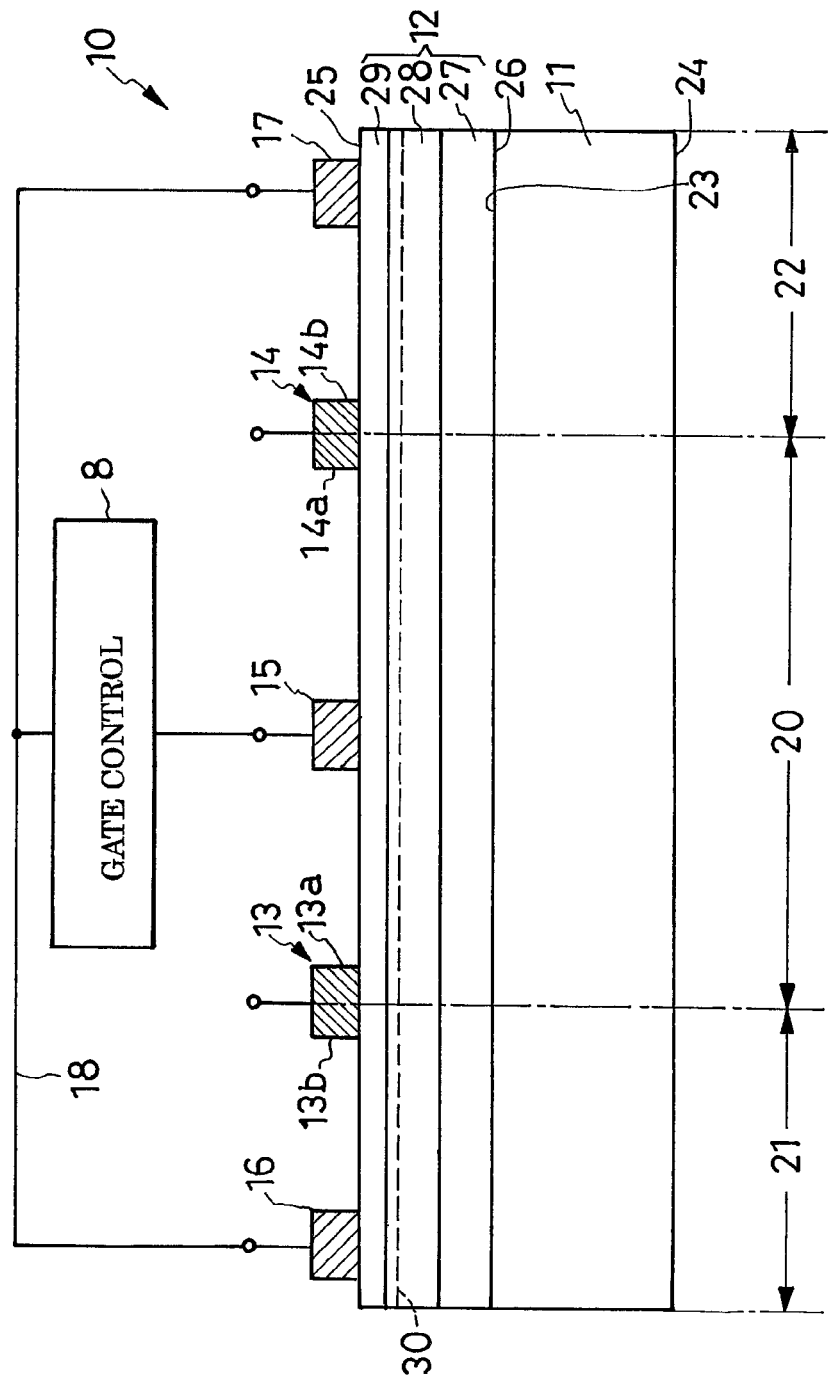
FIG. 3 is a schematic electrical diagram of the bidirectional switching device embodying the novel principles of this invention, the bidirectional switching device being shown together with a gate control circuit.
Figure 4:
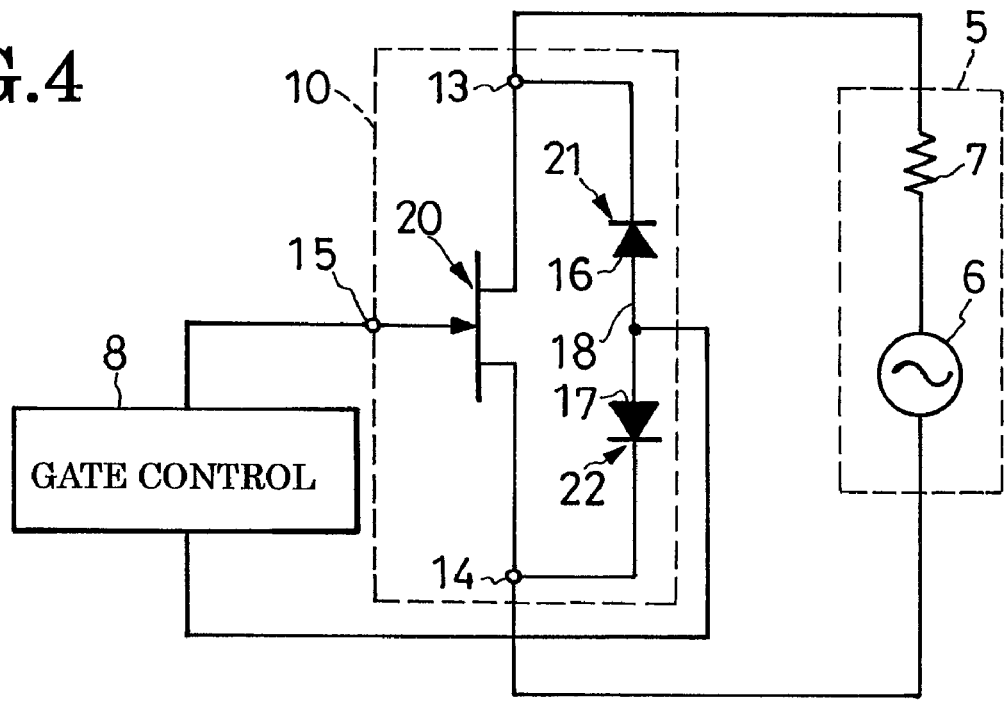
FIG. 4 is an equivalent electrical circuit diagram of the bidirectional switching device of FIG. 3, shown together with the gate control circuit and an alternating current circuit to be bidirectionally switched.

Embodiment of FIGS. 3 and 4

All these drawbacks of the prior art are totally absent from the bidirectional switching device according to the present invention, which will be described in detail in terms of its first preferred form illustrated in FIGS. 3 and 4 and therein generally designated 10. With reference first to FIG. 3 the representative bidirectional switching device 10 broadly comprises:

1. A substrate 11 of monocrystalline electroconductive silicon or other material.

2. A triple-layered main semiconductor region 12 grown by epitaxy on the substrate 11.

3. Two main electrodes 13 and 14 in spaced-apart positions on the surface of the main semiconductor region 12.

4. A gate electrode 15 interposed between the two main electrodes 13 and 14 on the surface of the main semiconductor region 12.

5. Two diode-forming electrodes 16 and 17 disposed on opposite sides of the gate electrode 15 on the surface of the main semiconductor region 12 and spaced farther away therefrom than are the main electrodes.

6. A conductor 18 electrically interconnecting the two diode-forming electrodes 16 and 17.

As indicated by the dot-and-dash lines in FIG. 3, the bidirectional switching device 10 is a monolithic, integral combination of a semiconductor switch 20 and two diodes 21 and 22. The semiconductor switch 20 takes the form of a high electron mobility transistor (HEMT), which is a type of field-effect transistor (FET), in this embodiment of the invention. The diodes 21 and 22 are both Schottky diodes.

FIG. 4 is a diagram of the equivalent electric circuit of the bidirectional switching device 10 of FIG. 3, shown together with an electric circuit 5 to be switched and a gate control circuit 8 for gating control of the semiconductor switch 20. Electrically, the bidirectional switching device 10 has the semiconductor switch 20 connected in parallel with an inversely serial connection of the diodes 21 and 22.

The electric circuit 5 comprises an AC power supply 6 and a load 7. The AC power supply 6 has one terminal connected via the load 7 to the first main electrode 13 of the bidirectional switching device 10, and another terminal connected to the second main electrode 14 of the bidirectional switching device. The gate control circuit 8 is connected between the conductor 18 interconnecting the diode-forming electrodes 16 and 17 and the gate electrode 15 of the semiconductor switch 20. A more detailed description of FIG. 3 follows.

Having a pair of opposite major surfaces 23 and 24, the substrate 11 provides a basis for epitaxial growth of the main semiconductor region 12 on its first major surface 23. The substrate 1 is of monocrystalline electroconductive silicon in this particular embodiment, although it might also be made from a semiconductor such as silicon carbide or from an insulator such as sapphire and ceramics.

The main semiconductor region 12 is a lamination of a buffer 27, a first semiconductor layer 28, and a second semiconductor layer 29. Since the semiconductor switch 20 is a HEMT in this embodiment as aforesaid, the first semiconductor layer 28 will be hereinafter referred to as the electron transit layer, and the second semiconductor layer 29 as the electron supply layer. As a whole the main semiconductor region 12 has a first major surface 25 facing away from the substrate 11 and a second major surface 26 held against the substrate.

The buffer 27 is grown in vapor phase on the substrate 1 by any known or suitable method such as metalorganic chemical vapor deposition (MOCVD) also known as metalorganic vapor phase epitaxy (MOVPE). In practice the buffer 27 may be either mono- or multi-layered. The multilayer option may comprise, for example, a desired number of alternations of an aluminum nitride (AlN) layer and a gallium nitride (GaN) layer. However, being not too closely associated with the operations of the other functional components, semiconductor switch 20 and diodes 21 and 22, of this bidirectional switching device 10, the buffer 27 is eliminable. The AlN and GaN layers are replaceable by other semiconducting nitrides or Groups III-V compounds.

Directly overlying the buffer 27 is the electron transit layer 28 which is made by MOCVD from an undoped semiconducting nitride to a thickness of 0.3-10.0 micrometers in this particular embodiment. As indicated by the broken line labeled 30, the electron transit layer 28 provides, in cooperation with the overlying electron supply layer 29 yet to be detailed, what is known in the art as a two-dimensional electron gas (2DEG) layer next to the heterojunction therebetween as the channel parallel to the major surface 25 of the main semiconductor region 12.

The semiconducting nitrides adoptable for the electron transit layer 28 are generally defined as:

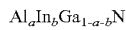

where the subscripts a and b are both numerals that are equal to or greater than zero and less than one. Other semiconducting compounds might be employed for the electron transit layer 28 as well.

The electron supply layer 29 is grown on the electron transit layer 28 by MOCVD from another semiconducting nitride to a thickness of 5-100 nanometers. The semiconducting nitrides for the electron supply layer 29 are greater in bandgap, and less in lattice constant, than those for the underlying electron transit layer 28. The semiconducting nitrides adoptable for the electron supply layer 29 are generally expressible by the formula:

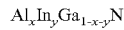

where the subscript x is a numeral that is greater than zero and less than one, and the subscript y is a numeral that is equal to or greater than zero and less than one. Alternately, the electron supply layer 29 may be made from n-doped $Al_xIn_yGa_{1-x-y}N$ or from other semiconducting nitrides or semiconducting compounds.

The first main electrode 13 is positioned on the surface 25 of the main semiconductor region 12 and on the boundary between the semiconductor switch 20 and the first diode 21. Thus is the first main electrode 13 functionally divided into a first main electrode (source or drain) section $13_a$, which belongs to the semiconductor switch 20, and a cathode section $13_b$ which belongs to the first diode 21.

The second main electrode 14 is positioned on the boundary between the semiconductor switch 20 and the second diode 22 on the surface 25 of the main semiconductor region 12. The second main electrode 14 is likewise functionally divided into a second main electrode (drain or source) section $14_a$ belonging to the semiconductor switch 20 and a cathode section $14_b$ belonging to the second diode 22.

From the standpoint of size reduction, the first main electrode 13 of the semiconductor switch 20 and the cathode of the first cathode 21 should be of one-piece construction, and so should be the second main electrode of the semiconductor switch 20 and the cathode of the second diode 22, as in this embodiment of the invention. However, in a broader aspect of the invention, the first main electrode section $13_a$ and cathode section $13_b$ of the first main electrode 13 may be formed as physically discrete parts and electrically interconnected via either the 2DEG layer 30 or some other conductor. The second main electrode section $14_a$ and cathode section $14_b$ of the second main electrode 14 may also be formed as physically discrete parts and similarly electrically interconnected.

Thus the term "first main electrode" should be construed to comprise, either integrally or separately, the first main electrode of the semiconductor switch 20 and the cathode of the first cathode 21. The term "second main electrode" should also be construed to comprise, either integrally or separately, the second main electrode of the semiconductor switch 20 and the cathode of the second cathode 22.

The first and the second main electrode 13 and 14 with their constituent sections make ohmic (low resistance) contact with the surface 25 of the main semiconductor region 12. Both electrodes 13 and 14 are made from a metal or metals, preferably a lamination of titanium and aluminum layers, that are capable of ohmic contact with the surface 25 of the main semiconductor region 12. It is understood that the electron supply layer 29 of the main semiconductor region 12 is so thin that its electrical resistance is negligibly small in its thickness direction. The main electrodes 13 and 14 are therefore practically electrically coupled to the 2DEG layer 30.

For gating the current flow between the two main electrodes 13 and 14, the gate electrode 15 is positioned intermediate these electrodes on the surface 25 of the main semiconductor region 12. The gate electrode 15 is also metal made, preferably in the form of a lamination of nickel and gold layers or of platinum and gold layers.

In order to make the antivoltage strength of the semiconductor switch 20 equal in both forward and reverse directions, the gate electrode 15 should be so positioned on the surface 25 of the main semiconductor region 12 that the semiconductor switch is of bilateral symmetry with respect to the gate electrode. The gate electrode 15 is therefore shown positioned at the midpoint between the two main electrodes 13 and 14. However, within limits tolerable for the semiconductor switch 20 to possess the required antivoltage strengths in both directions, the gate electrode 15 may be offset in either direction from the midpoint of the main electrodes 13 and 14. For most practical purposes the spacing between the gate electrode 15 and either of the first and second main electrodes 13 and 14 may be from −20% to +20% of the spacing between the gate electrode and the other of the two main electrodes.

In the semiconductor switch 20, which is in HEMT form in this embodiment, of this bidirectional switch 10, the two constituent semiconductor layers 28 and 29 are in a heterojunction. The second semiconductor layer 29 is therefore subjected to piezoelectric depolarization in addition to spontaneous depolarization. The depolarizations of the second semiconductor layer 29 result in creation of the 2DEG layer 30 along the interface between the semiconductor layers 28 and 29.

The semiconductor switch 20 is normally on. The 2DEG layer 30 is not interrupted under the gate electrode 15 when this gate electrode is zero in potential with respect to the second main electrode (source) 14 while a forward voltage is being impressed between the two main electrodes 13 and 14 (first main electrode 13 higher in potential than the second main electrode 14). The 2DEG layer 30 is uninterrupted, either, under the gate electrode 15 when this gate electrode is zero in potential with respect to the first main electrode (source) 13 while a negative voltage is being impressed between the two main electrodes 13 and 14 (first main electrode 13 less in potential than the second main electrode 14).

In order to turn off the semiconductor switch 20 during application of a forward voltage, the potential of the gate electrode 15 is dropped to a negative value (e.g., −5 volt) that is less than the threshold, with respect to the second main electrode 14 functioning as source. Also, for turning off the semiconductor switch 20 during application of a negative voltage, the potential of the gate electrode 15 is dropped to a negative value (e.g., −5 volt) that is less than the threshold, with respect to the first main electrode 13 functioning as source. With the gate electrode 15 thus made negative in potential with respect to the source, electrons will be deleted from that part of the first semiconductor layer 28 which underlies the gate electrode 15. A hiatus will then be created in the 2DEG layer 30, with consequent interception of current flow in either direction between the two main electrodes 13 and 14.

The first diode-forming electrode 16 is formed on the surface 25 of the main semiconductor region 12 in Schottky contact therewith and in a position opposite the gate electrode 15 across the first main electrode 13. The second diode-forming electrode 17 is also formed on the surface 25 of the main semiconductor region 12 in Schottky contact therewith, but in a position opposite the gate electrode 15 across the second main electrode 14. Like the gate electrode 15 these diode-forming electrodes 16 and 17 are both made from a metal or metals capable of Schottky contact with the main semiconductor region 12, preferably in the form of a lamination of nickel and gold layers or of platinum and gold layers.

Both diode-forming electrodes 16 and 17 serve as anodes for the diodes 21 and 22, respectively. Consequently, the first diode 21 is reverse biased, and the second diode 22 forward biased, upon application of a forward voltage. The first diode 21 is forward biased, and the second diode 22 reverse biased, upon application of a reverse voltage. When the first diode 21 is forward biased while the semiconductor switch 20 is on, there is completed through this first diode a path which sequentially comprises the first diode-forming electrode 16, first semiconductor layer 29, 2DEG layer 30, first semiconductor layer 29, and first main electrode 13. On the other hand, when the second diode 22 is forward biased while the semiconductor switch 20 is on, there is completed through this second diode a path which sequentially comprises the second diode-forming electrode 17, first semiconductor layer 29, 2DEG layer 30, first semiconductor layer 29, and second main electrode 14.

Electrically interconnecting the two diode-forming electrodes 16 and 17, the conductor 18 may be formed on an insulating film, not shown, covering the surface 25 of the main semiconductor region 12, for reduction of the size of the device 10 to an absolute minimum. Alternatively, the conductor 18 may be an independent piece of wire terminally bonded to the diode-forming electrodes 16 and 17.

In use of the bidirectional switching device 10, constructed as hereinbefore described with reference to FIG. 3, the electric circuit 5 to be switched may be connected between the two main electrodes 13 and 14, and the gate control circuit 8 between the gate electrode 15 and conductor 18, both as shown in FIG. 4. The normally-on semiconductor switch 20 is off, and so is the bidirectional switching device 10, when, under the direction of the gate control circuit 8, the potential of the gate electrode 15 is caused to have a negative value less than the threshold with respect to the second main electrode 14 functioning as source, while the first main electrode 13 is higher in potential than the second main electrode 14. The potential difference between second main electrode 14 and conductor 18 does not rise above the forward bias voltage of the second diode 22, but is approximately 0.7 volt at most, when the first main electrode 13 is higher in potential than the second main electrode 14. The potential of the conductor 18 might therefore be considered the reference potential of the gate.

Since the bidirectional switching device 10 is of symmetrical make with respect to the gate, the semiconductor switch 20 is off, and so is the device 10, when the gate electrode 15 is caused by the gate control circuit 8 to possess a negative potential less than the threshold with respect to the first main electrode 13 functioning as source, while the second main electrode 14 is higher in potential than the first main electrode 13. Here again the potential difference between first main electrode 13 and conductor 18 does not grow higher than the forward bias voltage of the first diode 21, but is approximately 0.7 volt at most, when the second main electrode 14 is higher in potential than the first main electrode 13.

The semiconductor switch 20 is on, and so is the bidirectional switching device 10, when the gate electrode 15 is caused by the gate control circuit 8 to have a potential (either zero or some positive value) higher than the threshold of the switch 20 with respect to the first 13 or second 14 main electrode functioning as source.

The benefits offered by the above described embodiment of the invention may be recapitulated as follows:

1. The bidirectional switching device 10 according to the invention is electrically equivalent to the prior art device proposed by WO 2004/114508, as is apparent from a comparison of FIGS. 2 and 4, but is far simpler and more compact in construction, monolithically integrating all the necessary components. More specifically, the semiconductor switch 20 and two diodes 21 and 22 share one and the same main semiconductor region 12 grown on one and the same substrate 11.

2. The diodes 21 and 22 serve for determination of the reference potential of the gate, not for the flow of load current. Consequently, these diodes need much less parts of the main semiconductor region 12 than the part required by the semiconductor switch 20.

3. Since the semiconductor switch 20 is a HEMT utilizing the 2DEG layer 30, and the diodes 21 and 22 Schottky diodes also utilizing the 2DEG layer, the bidirectional switching device 10 as a whole is capable of high speed operation and relatively low in on-state resistance.

4. The two main electrodes 13 and 14 serve both as source or drain for the semiconductor switch 20 and as cathodes for the diodes 21 and 22, so that the bidirectional switching device 10 is further made smaller in size and simpler and cheaper of manufacture.

5. The two diode-forming electrodes 16 and 17, as well as the two main electrodes 13 and 14, are electrically interconnected via the 2DEG layer 30, rather than via external conductors, making the device 10 less in parasitic impedance and higher in operating speed.

6. Both semiconductor switch 20 and diodes 21 and 22 are improved in antivoltage strength as the main semiconductor region 12 is made from semiconducting nitrides or derivatives thereof.

7. The diode-forming electrodes 16 and 17 are both made from the same material as the gate electrode 15 and so require no additional manufacturing step for fabrication of them alone.

Figure 6:
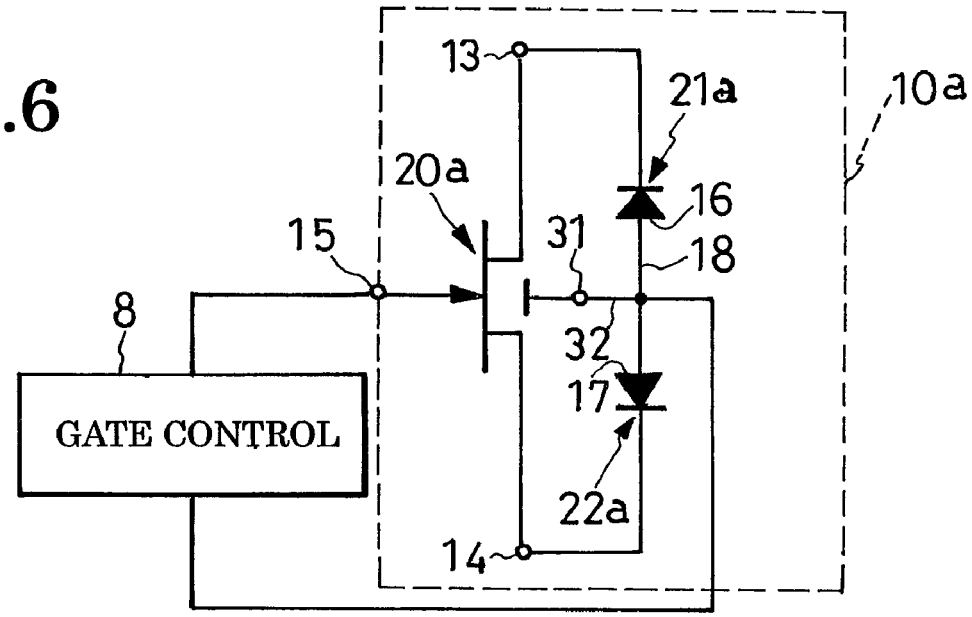
FIG. 6 is an equivalent electrical circuit diagram of the bidirectional switching device of FIG. 5 shown together with the gate control circuit.
Figure 5:
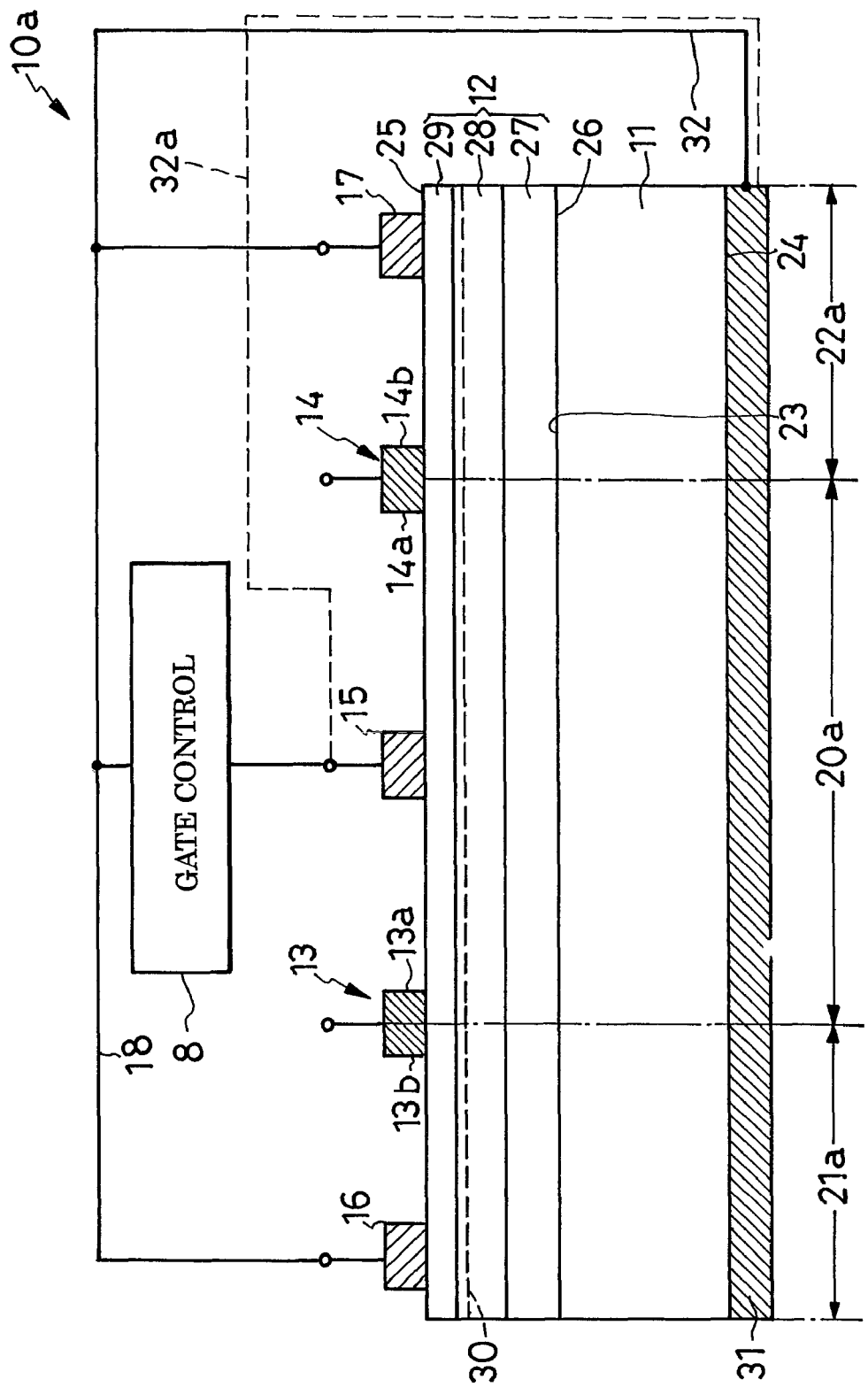
FIG. 5 is a diagram similar to FIG. 3 but showing another preferred form of bidirectional switching device according to the invention.

Embodiment of FIGS. 5 and 6

Referring to FIG. 5 in particular, this bidirectional switching device $10_a$ features a modified semiconductor switch $20_a$ and modified diodes $21_a$ and $22_a$, all the other details of construction being the same as those of the first disclosed embodiment set forth with reference to FIG. 3. The modified semiconductor switch $20_a$ and modified diodes $21_a$ and $22_a$ are akin to their FIG. 3 counterparts 20-22 except that a substrate electrode 31, known also as a back electrode, is affixed to the back or bottom surface 24 of the electroconductive substrate 11 in electrical conducting relationship. Additionally, the substrate electrode 31 is electrically coupled to the conductor 18 via another conductor 32 and, through these conductors 18 and 32, to both diode-forming electrodes 16 and 17.

FIG. 6 is an equivalent electrical circuit diagram of the bidirectional switching device 10a, shown together with the gate control circuit 8 connected between the gate electrode 15 and the conductor 18. The bidirectional switching device $10_a$ is of the same basic construction, both mechanically and electrically, as the first disclosed device 10 and so gains the same advantages therewith. Furthermore, having the substrate electrode 31 electrically connected directly to the substrate 11 and, via the conductors 18 and 32, to the two diode-forming electrodes 16 and 17, the switching device $10_a$ has the potential of its substrate 11 more stabilized than in the absence of the substrate electrode as in the preceding embodiment.

As is well known, in the HEMT in general, the substrate is preferentially electrically coupled to either the source or the drain in order to possess the same potential therewith. However, this scheme is not directly applicable to bidirectional switching HEMTs such as the one according to the instant invention. In FIG. 5, for instance, it is the second main electrode 14 that functions as source when a forward voltage is impressed between the two main electrodes 13 and 14. The first main electrode 13 functions as source upon application of a negative voltage between the main electrodes 13 and 14. The substrate 11 is therefore not permanently connectable to either of the main electrodes 13 and 14. Left "floating", the substrate would have its potential approximately midway between the potentials of the main electrodes 13 and 14. The substrate potential would fluctuate with the voltage of the AC power supply 6.

This shortcoming is overcome in the bidirectional switching device $10_a$ in which the substrate electrode 31 is electrically coupled to both diode-forming electrodes 16 and 17. The electroconductive substrate 11 will then acquire a voltage (approximately 0.7 volt at most) close to that of either of the main electrodes 13 and 14 functioning as source. The substrate potential will thus be stabilized at a value close to the potential of the source electrode, whichever of the two main electrodes 13 and 14 it is. The complete bidirectional switching device $20_a$ will then operate more stably. Similar results will be obtained if the substrate electrode 31 is electrically coupled to the gate electrode 15, as indicated by the dashed line $32_a$ in FIG. 5, instead of to the conductor 18.

Figure 7:
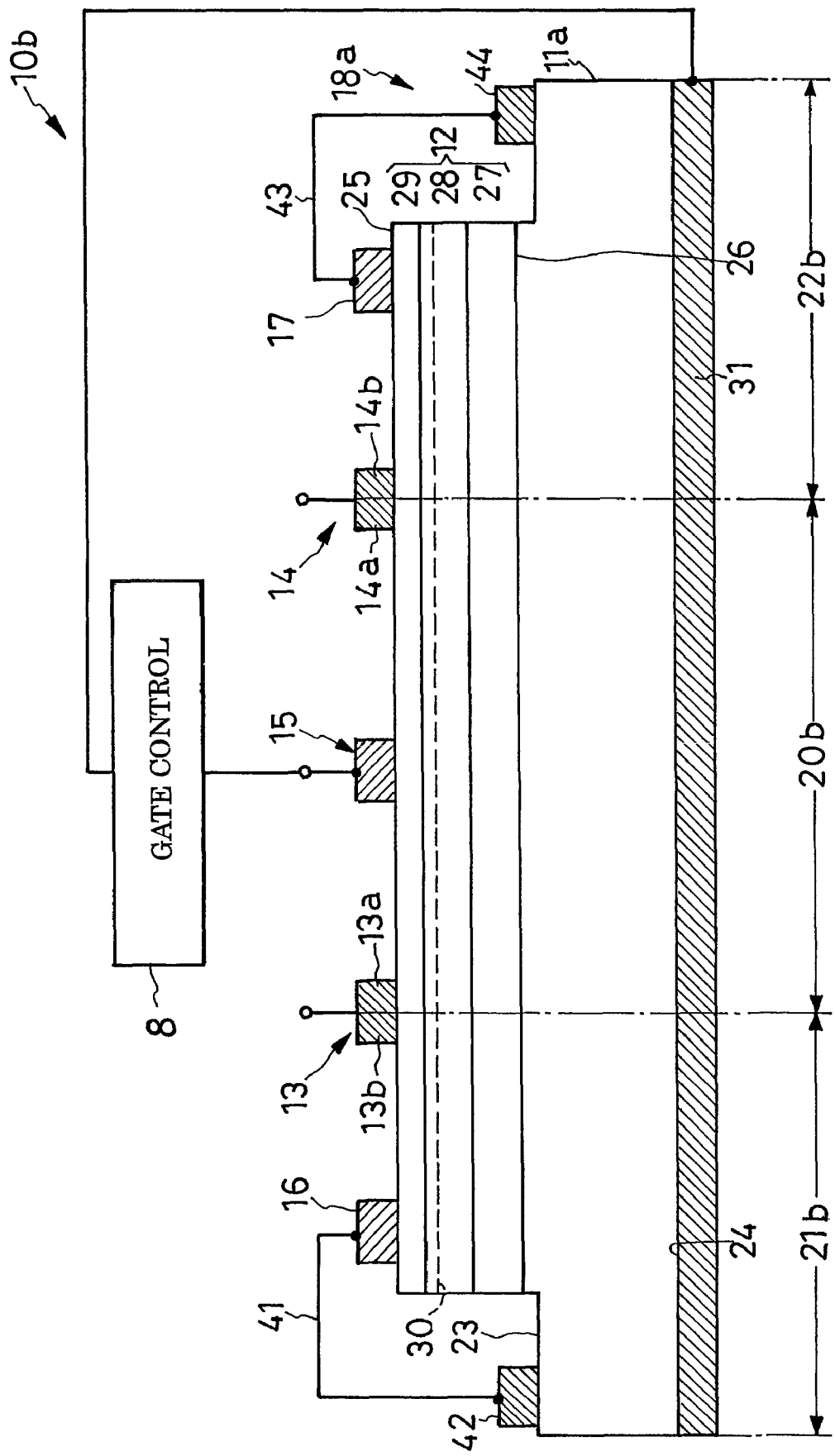
FIG. 7 is a diagram similar to FIG. 3 but showing still another preferred form of bidirectional switching device according to the invention.

Embodiment of FIG. 7

The semiconductor switch $20_b$ and diodes $21_b$ and $22_b$ of this bidirectional switching device $10_b$ are similar to their FIG. 5 counterparts $20_a$, $21_a$ and $22_a$ in having the substrate electrode 31 on the back 24 of the silicon substrate 11a. The substrate electrode 31 is electrically connected to the gate electrode 15 via the gate control circuit 8 but, unlike the preceding embodiments, not directly to the diode-forming electrodes 16 and 17. This embodiment features the following means $18_a$ for electrically interconnecting the two diode-forming electrodes 16 and 17 but is otherwise identical with that of FIG. 3.

The first diode-forming electrode 16 is electrically coupled to the electroconductive substrate $11_a$ via a conductor 41 and bonding pad 42, the latter being formed on a ledge 23 of the substrate. The second diode-forming electrode 17 is electrically coupled to the substrate $11_a$ via another conductor 43 and another bonding pad 44 on another ledge of the substrate. Thus the two diode-forming electrodes 16 and 17 are electrically interconnected via the first conductor 41, first bonding pad 42, substrate $11_a$, second bonding pad 44, and second conductor 43. As an obvious alternative to this interconnection route, the diode-forming electrodes 16 and 17 might be interconnected via the substrate electrode 31.

Electrically, this switching device $10_b$ is akin to its FIG. 5 counterpart $10_a$, the equivalent electric circuit of which is diagramed in FIG. 6. The switching device $10_b$ possesses the advantage, in addition to all those listed in conjunction with the FIG. 5 embodiment, of less spaces required for interconnection of the diode-forming electrodes 16 and 17, such interconnection being made through the substrate $11_a$. The interconnection of the diode-forming electrodes 16 and 17 through the substrate $11_a$ may be opted for in applications where further reduction in size and the stability of substrate potential are desired.

Figure 8:
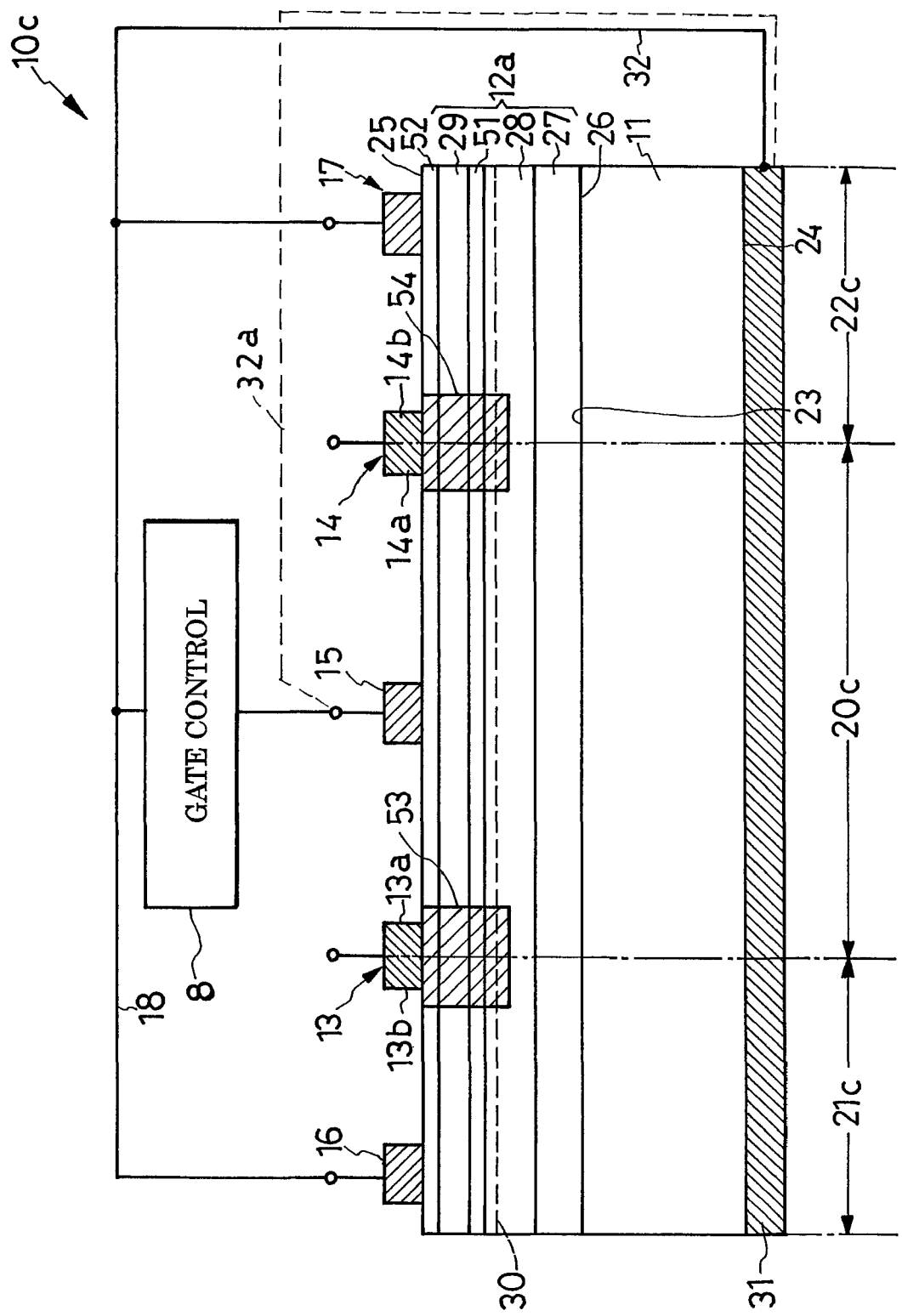
FIG. 8 is also a diagram similar to FIG. 3 but showing yet another preferred form of bidirectional switching device according to the invention.

Embodiment of FIG. 8

The main semiconductor region $12_a$ of this embodiment, extending throughout the semiconductor switch $20_c$ and diodes $21_c$ and $22_c$, contain some features that are absent from all the foregoing embodiments. The modified main semiconductor region $12_a$ comprises a spacer layer 51 and cap layer 52 in addition to the buffer layer 27, electron transit layer 28 and electron supply layer 29, the latter three being all existing in the main semiconductor region 12 of the foregoing embodiments. Interposed between electron transit layer 28 and electron supply layer 29, the spacer layer 51 is made from undoped aluminum nitride (AlN) or aluminum indium gallium nitride (AlInGaN). The cap layer 52, overlying the electron supply layer 29, is made from undoped aluminum gallium nitride (AlGaN) for surface charge control.

Additional features of this invention reside in contact regions 53 and 54 which are indicated by the hatchings for clarity. These contact regions 53 and 54 are formed by doping an n-type impurity into those parts of the main semiconductor region $12_a$ which immediately underlie the two main electrodes 13 and 14. This embodiment is similar to that of FIG. 5 in all the other details of construction.

The spacer layer 51 of the main semiconductor region $12_a$ serves to prevent a drop in electron mobility in the 2DEG layer 30. The contact regions 53 and 54 functions for reduction of contact resistance between the main electrodes 13 and 14 and the main semiconductor region $12_a$. These contact regions 53 and 54 might be formed by filling the depressions created under the main electrodes 13. The other benefits of this embodiment are as previously set forth with reference to FIG. 5 in particular. The teachings of this embodiment are applicable to the devices of FIGS. 3 and 7.

Figure 9:
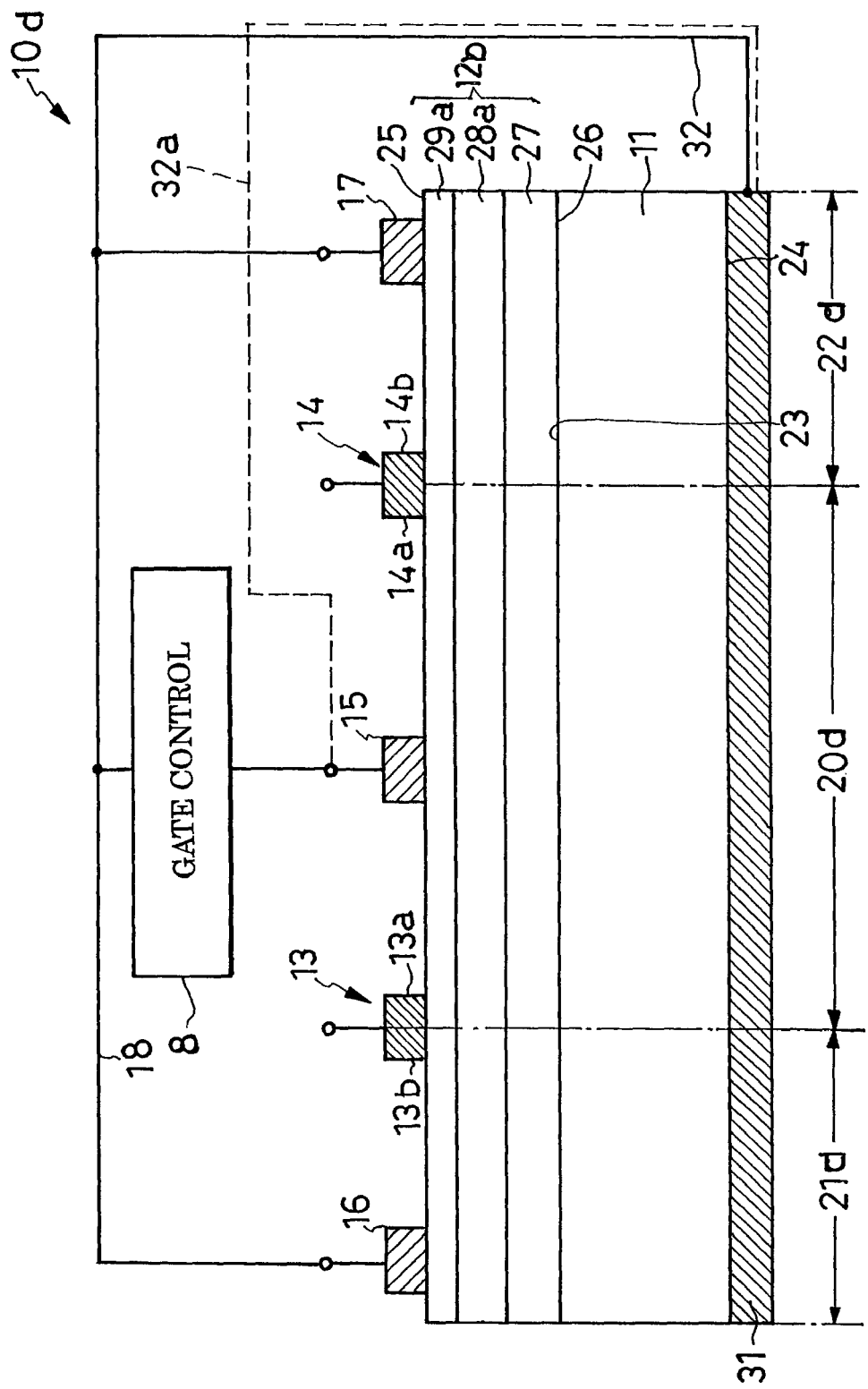
FIG. 9 is also a diagram similar to FIG. 3 but showing still another preferred form of bidirectional switching device according to the invention.

Embodiment of FIG. 9

This bidirectional switching device $10_d$ has its main semiconductor region $12_b$ reconfigured to provide a metal semiconductor field effect transistor (MESFET) for its semiconductor switch $20_d$. The main semiconductor region $12_b$ is a lamination of the buffer 27, a first semiconductor layer $28_a$ of undoped GaN overlying the buffer, and a second semiconductor layer $29_a$ of n-type GaN formed by ion implantation of an n-type impurity (e.g., silicon) into excess part of the preformed first semiconductor layer $28_a$. The two diodes $21_d$ and $22_d$ of this device $10_d$ are of the same make as their FIG. 5 counterparts $21_a$ and $22_a$. The electrical connections of all the pertinent parts of the device $10_d$ are also as set forth above with reference to FIG. 5.

It is the second semiconductor layer $29_a$ that provides the channel through the main semiconductor region $12_b$ in this embodiment. Normally, when the Schottky gate electrode 15 of the MESFET switch $20_d$ is equal in potential to either of the two main electrodes 13 and 14 that is functioning as source, the channel through the second semiconductor layer $29_a$ is completed. This channel opens under the field effect when the gate electrode 15 becomes negative in potential with respect to either of the main electrodes 13 and 14 that is functioning as source. It is therefore apparent that this MESFET switch $20_d$ lends itself to the same use as does the HEMT switch 20 or $20_a$ of FIGS. 3 and 5. The diode-forming electrodes 16 and 17 make Schottky contact with the second semiconductor layer $29_a$ of the main semiconductor region $12_b$ to form Schottky diodes.

Functionally, the MESFET switch $20_d$ and diodes $21_d$ and $22_d$ of this device $10_d$ are equivalent respectively to the HEMT switch $20_a$ and diodes $21_a$ and $22_a$ of the FIG. 5 device $10_a$ so that the former device $10_d$ gains the same benefits as does the latter $10_a$. The main semiconductor region $12_b$ of the device $10_d$ is substitutable for the main semiconductor regions 12 and $12_a$ of FIGS. 3, 7 and 8.

Figure 10:
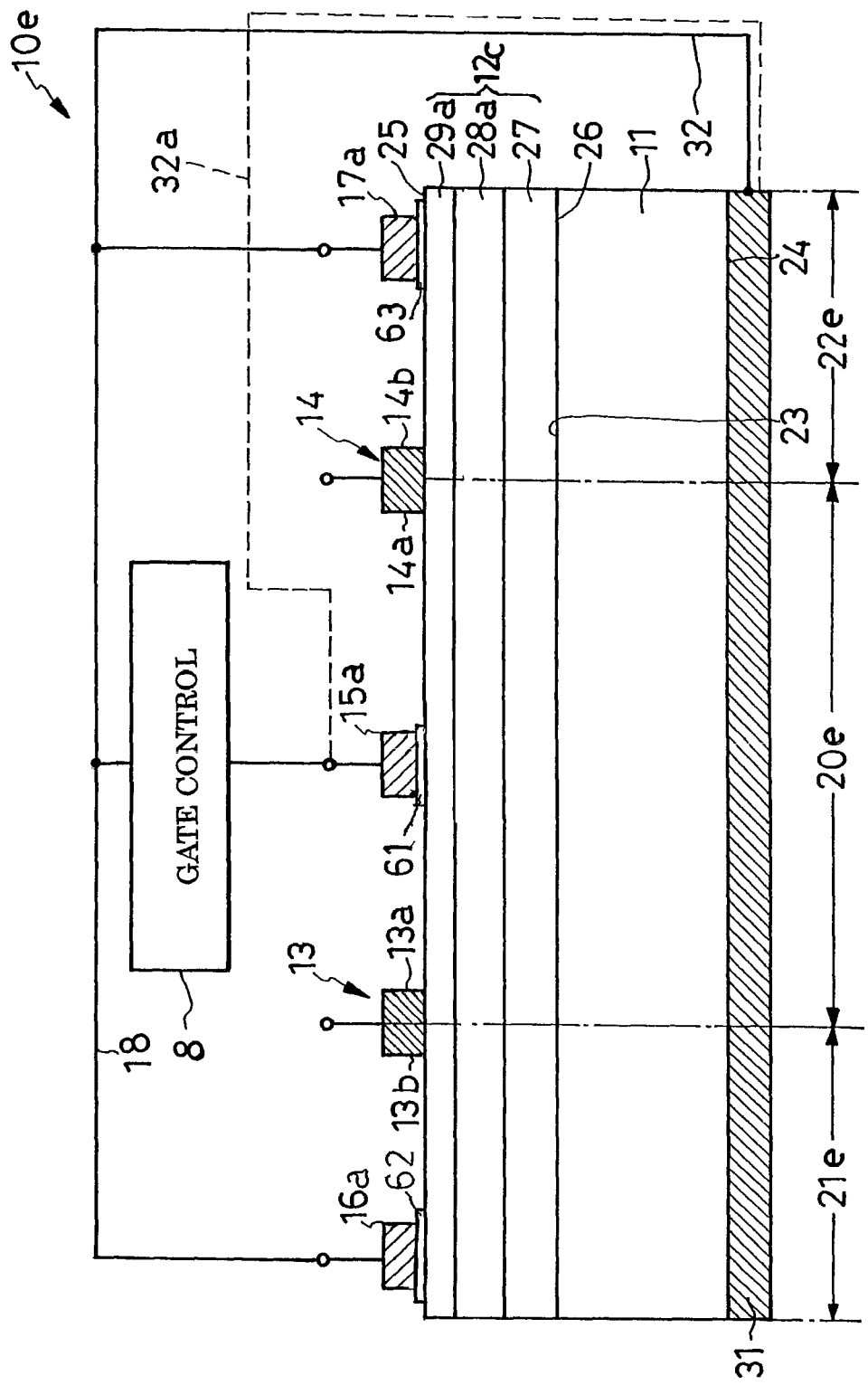
FIG. 10 is also a diagram similar to FIG. 3 but showing a further preferred form of bidirectional switching device according to the invention.

Embodiment of FIG. 10

This bidirectional switching device $10_e$ is analogous in construction with its FIG. 9 counterpart $10_d$ except for a main semiconductor region $12_c$, gate electrode $15_a$, and diode-forming electrodes $16_a$ and $17_a$. The main semiconductor region $12_c$ has, in addition to the lamination of three layers 27, $28_a$ and $29_a$ similar to those in FIG. 9, a p-type semiconductor layer which overlies the n-type semiconductor layer $29_a$ and which is separated into three parts 61, 62 and 63.

Positioned under the gate electrode $15_a$, the first part 61 of the p-type semiconductor layer forms a pn-junction with the underlying n-type semiconductor layer $29_a$ and so provides a junction field-effect transistor (JFET) switch $20_e$. The second and third p-type semiconductor layer parts 62 and 63 underlie the two diode-forming electrodes $16_a$ and $17_a$, forming pn-junctions with the underlying n-type semiconductor layer $29_a$ and so providing diodes $21_e$ and $22_e$. The gate electrode $15_a$ and diode-forming electrodes $16_a$ and $17_a$ are all in ohmic contact with the p-type semiconductor layer parts 61-63.

The JFET switch $20_e$ turns on when there is impressed from the gate control circuit 8 to the gate electrode $15_a$ a voltage in excess of a threshold with respect to either of the two main electrodes 14 and 15 that is functioning as source. The JFET switch $20_e$ turns off when the voltage drops below the threshold. The JFET switch $20_e$ and diodes $21_e$ and $22_e$ of this bidirectional switching device $10_e$ are functionally equivalent to the HEMT switch $20_a$ and diodes $21_a$ and $22_a$ of the FIG. 5 device $10a$, so that the device $10_e$ obtains the same benefits as does the device $10_a$.

This device $10_e$ permits a variety of modifications. For example, the substrate electrode 31 is omissible. Second, only the first p-type semiconductor layer part 61 may be provided under the gate electrode $15_a$, and the other p-type semiconductor layer parts 62 and 63 may be removed from under the diode-forming electrodes $16_a$ and $17_a$ thereby providing Schottky diodes. Alternatively, the first p-type semiconductor layer part 61 may be omitted to provide a Schottky or other type of gate electrode, and the other two p-type semiconductor layer parts 62 and 63 may be left under the diode-forming electrodes $16_a$ and $17_a$.

Figure 11:
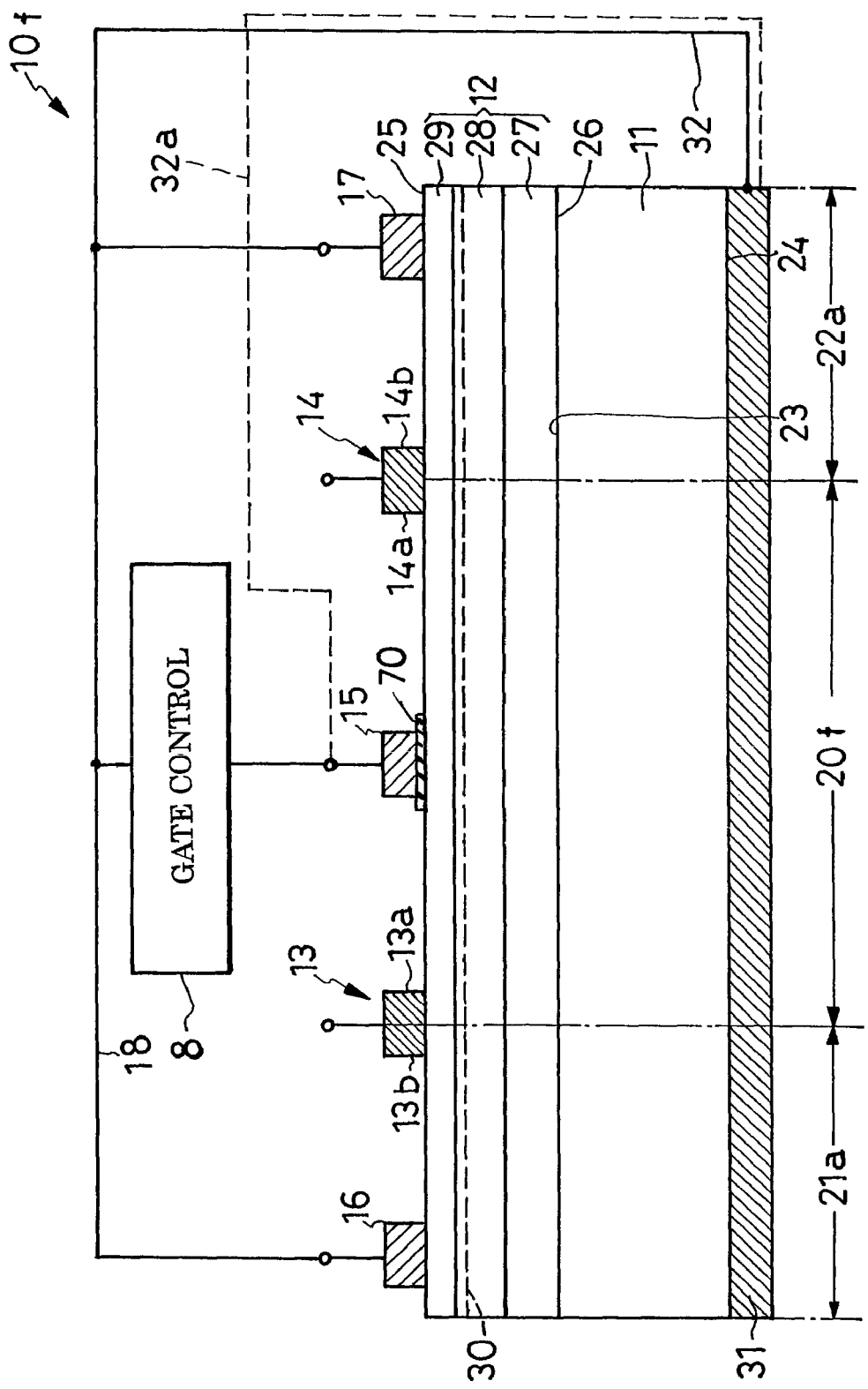
FIG. 11 is also a diagram similar to FIG. 3 but showing a still further preferred form of bidirectional switching device according to the invention.

Embodiment of FIG. 11

A gate insulator 70 is inserted in this bidirectional switching device $10_f$ between main semiconductor region 12 and gate electrode 15 to provide a modified semiconductor switch $20_f$. All the other details of construction are as above described with reference to FIG. 5.

The gate insulator 70 notwithstanding, the semiconductor switch $20_f$ operates just like its FIG. 5 counterpart $20a$, so that the device $10_f$ has all the benefits of the FIG. 5 device $10_a$. The gate electrodes of the FIGS. 3 and 7-9 could be similarly insulated from the main semiconductor region.

Possible Modifications

Despite the foregoing detailed disclosure it is not desired that the present invention be limited by the exact showing of the drawings or the description thereof. The following is a brief list of possible modifications, alterations or adaptations of the illustrated embodiments which are all believed to fall within the purview of this invention:

1. The main semiconductor regions 12, $12_a$-$12_c$ of the various embodiments disclosed herein could be made from semiconducting nitrides such as GaN, AlGaN, InGaN, AlInGaN, AlN, and InAlN, as well as derivatives thereof, from Groups III-V compound semiconductors such as AlP, GaP, AlInP, GaInP, AlGaP, AlGaAs, GaAs, AlAs, InAs, InP, InN, and GaAsP, from Groups II-VI compound semiconductors such as ZnO, or from other compound semiconductors.

2. The semiconductor switches 20, 20$_a$-20$_f$ of the various embodiments disclosed herein could be furnished with a known field plate.

3. The second semiconductor layer 29 of the main semiconductor regions 12 and 12$_a$ of HEMT configuration in the embodiments of FIGS. 3, 5, 7, 8 and 11 may be replaced by a hole supply layer of a p-type semiconductor. In that case a two-dimensional hole gas will be generated in place of the 2DEG layer 30. The term comprehending both electron gas and hole gas is "carrier gas."

4. The n-type second semiconductor layer 29$_a$ in the main semiconductor region 12$_b$, FIG. 9, is also replaceable by a p-type semiconductor layer.

5. In the embodiment of FIG. 10, too, the n-type second semiconductor layer 29$_a$ of the main semiconductor region 12$_c$ is replaceable by a p-type semiconductor layer, and the p-type semiconductor layer parts 61-63 by n-type ones.

6. A normally-off HEMT switch could be adopted in the embodiments of FIGS. 3, 5, 7, 8 and 11 as by receiving the gate electrode 15 in a recess formed in the second semiconductor layer 29 or by interposing a p-type semiconductor layer between gate electrode 15 and second semiconductor layer 29.

7. The semiconductor switches 20$_d$ and 20$_e$ of the FIGS. 9 and 10 embodiments could also be made normally off.

What is claimed is:

1. A bidirectional switching device comprising:
   (a) a main semiconductor region comprising at least one semiconductor layer for providing a channel, the main semiconductor region having a major surface;
   (b) a first main electrode formed in ohmic contact with the major surface of the main semiconductor region;
   (c) a second main electrode formed in ohmic contact with the major surface of the main semiconductor region, the second main electrode provided in a spaced-apart position with respect to the first main electrode;
   (d) gate means formed between the first and the second main electrodes on the major surface of the main semiconductor region for controlling current flow between the first and the second main electrodes;
   (e) a first diode-forming electrode formed on the major surface of the main semiconductor region, the first diode-forming electrode disposed opposite the gate means across the first main electrode;
   (f) a second diode-forming electrode formed on the major surface of the main semiconductor region, the second diode-forming electrode disposed opposite the gate means across the second main electrode; and
   (g) means for electrically interconnecting the first and the second diode-forming electrodes.

2. A bidirectional switching device as defined in claim 1, further comprising a gate control circuit connected between the gate means and the electrically interconnecting means.

3. A bidirectional switching device as defined in claim 1, wherein the main semiconductor region has at least two semiconductor layers capable of generating a two-dimensional carrier gas layer as the channel.

4. A bidirectional switching device as defined in claim 1, wherein the main semiconductor region comprises a first-conductivity-type semiconductor layer for functioning as the channel.

5. A bidirectional switching device as defined in claim 4, wherein
   the main semiconductor region further comprises a first second-conductivity-type semiconductor layer formed between the first diode-forming electrode and the first-conductivity-type semiconductor layer, and a second second-conductivity-type semiconductor layer formed between the second diode-forming electrode and the first-conductivity-type semiconductor layer,
   the first diode-forming electrode is formed in ohmic contact with the first second-conductivity-type semiconductor layer, and
   the second diode-forming electrode is formed in ohmic contact with the second second-conductivity-type semiconductor layer.

6. A bidirectional switching device as defined in claim 1, wherein the gate means comprises a gate electrode formed in Schottky contact with the major surface of the main semiconductor region.

7. A bidirectional switching device as defined in claim 1, wherein the gate means comprises:
   a gate insulator formed on the major surface of the main semiconductor region, and
   a gate electrode formed on the gate insulator.

8. A bidirectional switching device as defined in claim 1, wherein the first and the second diode-forming electrode are formed in Schottky contact with the major surface of the main semiconductor region.

9. A bidirectional switching device as defined in claim 1, further comprising:
   (a) a substrate of electroconductive material having the main semiconductor region formed thereon; and
   (b) means electrically connecting the substrate to the electrically interconnecting means.

10. A bidirectional switching device as defined in claim 1, wherein:
    the main semiconductor region is formed on a substrate of electroconductive material in electrically conducting relationship,
    a substrate electrode is formed on the substrate, and
    the electrically interconnecting means comprises:
    (a) a first conductor electrically connecting the first diode-forming electrode to the substrate electrode; and
    (b) a second conductor electrically connecting the second diode-forming electrode to the substrate electrode.

* * * * *